United States Patent [19]

Kosonocky et al.

[11] Patent Number: 4,548,671

[45] Date of Patent: Oct. 22, 1985

[54] METHOD OF MAKING A CHARGE-COUPLED DEVICE IMAGER WHICH INCLUDES AN ARRAY OF SCHOTTKY-BARRIER DETECTORS

[75] Inventors: Walter F. Kosonocky, Montgomery Township, Somerset County; Frank V. L. Shallcross, West Windsor Township, Mercer County, both of N.J.

[73] Assignee: RCA Corporation, Princeton, N.J.

[21] Appl. No.: 633,437

[22] Filed: Jul. 23, 1984

[51] Int. Cl.⁴ .................. H01L 21/306; B44C 1/22; C03C 15/00; C23F 1/02
[52] U.S. Cl. .................. 156/643; 29/576 R; 148/187; 156/653; 156/657; 156/662; 357/15; 357/24; 357/30; 427/84
[58] Field of Search ............... 156/643, 646, 653, 656, 156/657, 659.1, 661.1, 662; 427/38, 39, 84, 85, 86, 88-91, 93; 357/24, 15, 30; 430/313, 317, 318, 319; 29/571, 576 R, 580, 591; 148/1.5, 187

[56] References Cited

U.S. PATENT DOCUMENTS 3,481,781  12/1969  Kern .................................. 117/215

OTHER PUBLICATIONS

"Design and Performance of 64×128 Element PtSi; Schottky-Barrier Infra-Red Charge-Coupled Device (IRCCD) Focal Plane Array", W. F. Kosonocky et al., SPIE, vol. 344, *Infrared Sensor Technology* (1982), pp. 66-77.

U.S. patent application of W. F. Kosonocky, Ser. No. 616,199, filed Jun. 1, 1984, Entitled "Infra-Red Charge-Coupled Device Image Sensor".

Primary Examiner—William A. Powell
Attorney, Agent, or Firm—Brigit E. Morris; Donald S. Cohen

[57] ABSTRACT

A method of making an imager which includes substrate of single crystalline silicon having on one surface of a plurality of spaced detectors arranged in columns and a charge-coupled device between each pair of columns of the detectors. The charge-coupled devices are formed first with the gates of the charge-coupled devices defining detector areas of the substrate surface. A guard-ring is formed in each detector area with the edges of the gates around the detector area defining one edge of the guard-ring so that the guard-rings are aligned with the edges of the surrounding gates. A layer of insulating material is formed over the detector areas with the portion of the insulating layer over the guard-ring being thicker than the remaining portion of the insulating layer. The thinner portion of the insulating layer is removed leaving the thicker portion over the guard-ring region and with an edge of the thicker portion being substantially in alignment with an edge of the guard-ring region. A conductive layer is formed on the exposed portion of the detector areas of the substrate surface with the conductive layer forming a Schottky-barrier junction with the substrate.

26 Claims, 14 Drawing Figures

METHOD OF MAKING A CHARGE-COUPLED DEVICE IMAGER WHICH INCLUDES AN ARRAY OF SCHOTTKY-BARRIER DETECTORS

The present invention relates to a method of making an array of Schottky-barrier detectors in a charge-coupled device imager, and more particularly to a method of making such an imager with the detectors being self-aligned to the charge-coupled devices.

BACKGROUND OF THE INVENTION

There has been developed an infra-red sensing charge-coupled device (IR-CCD) imager which utilizes Schottky-barrier detectors for sensing the infra-red radiation and charge-coupled devices for transferring the detected signal from the detectors. One construction of such an imager is described in the article of W. F. Kosonocky et al., entitled "Design and Performance of 64×128 Element PtSi Schottky-barrier Infra-Red Charge-Coupled Device (IRCCD) Focal Plane Array", SPIE, Volume 344, *Infrared Sensor Technology* (1982), pp. 66-77. One problem with such imagers is to achieve a high-fill factor. "Fill-factor" is a term used to designate the ratio of the active detector area to the total area of the imager. The higher the fill-factor, the greater the sensitivity of the imager since its detector area is greater which permits the detection of a larger amount of infrared radiation. In order to increase the fill-factor it is desirable to minimize the area of the substrate in which the imager is formed which is taken-up by the non-detecting elements, such as the charge-coupled devices, and to have the detector elements fill up all of the area which is not used by the non-detecting elements. To have the detector elements cover all of the area available for them, it is desirable to have a process which forms the detector elements right up to the edges of the non-detecting elements, i.e., uses the non-detecting elements as the alignment means for the detector elements.

SUMMARY OF THE INVENTION

A method of making an imager which includes a substrate of single crystalline silicon having along one surface thereof a charge-coupled device formed of a channel region within the substrate and extending along the substrate surface and a plurality of conductive gates along the channel and extending transversely thereacross includes the steps of forming in the substrate at the one surface a narrow guard-ring region which extends along and has one edge which is in substantial alignment with the ends of at least some of the gates and a second edge spaced from the ends of the gates. A layer of insulating material is formed over the guard-ring region with an edge of the insulating layer being in substantial alignment with the second edge of the guard region. A conductive layer which forms a Schottky-barrier junction with the substrate is formed on the surface of the substrate with the conductive layer having an edge in substantial alignment with the second edge of the guard-ring region.

DETAILED DESCRIPTION OF THE PREFERRED EMBODIMENT

Figure 1:
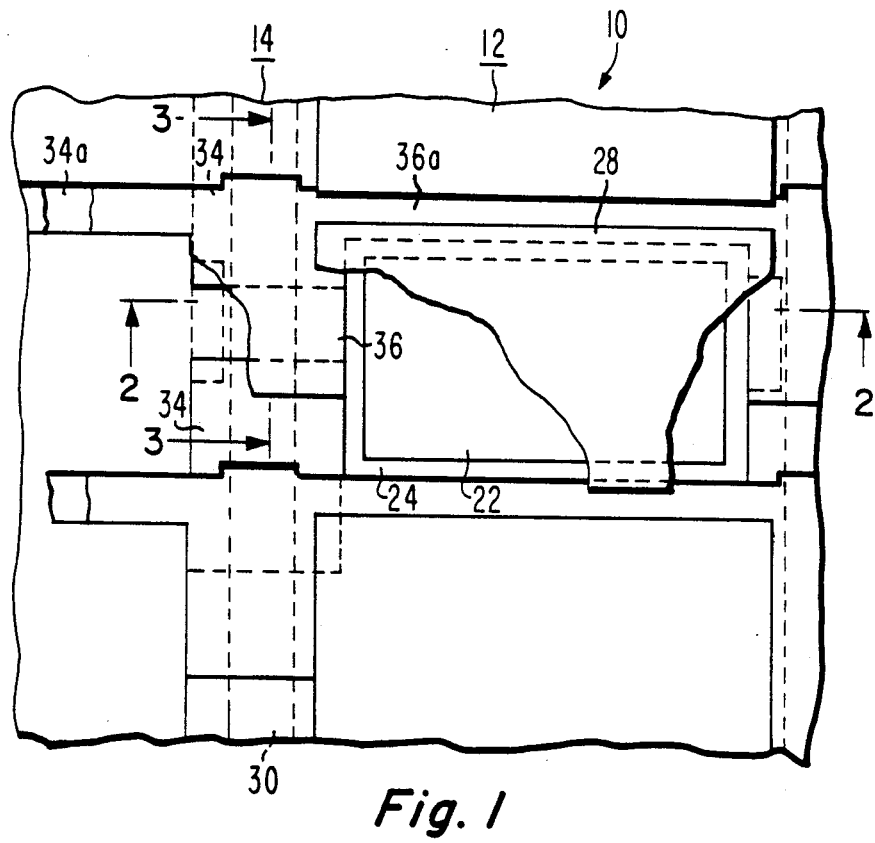
FIG. 1 is a top plan view of a portion of one form of an IR-CCD imager which can be made by the process of the present invention.
Figure 2:
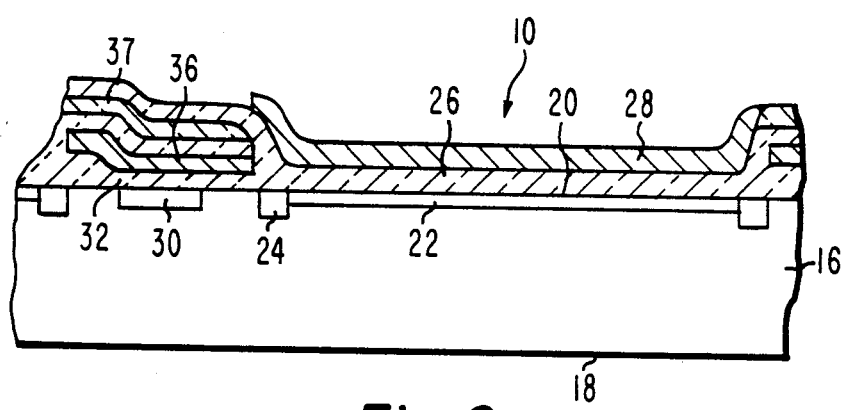
FIG. 2 is a sectional view taken along line 2—2 of FIG. 1.

Referring to FIGS. 1 and 2, an IR-CCD imager which can be made by the present invention is generally designated as 10. Imager 10 includes an array of detectors 12 arranged in columns, and vertical CCD registers 14 between the columns of the detectors 12. The imager 10 is formed in a substrate 16 of P type conductivity single crystalline silicon having opposed major surfaces 18 and 20.

Each of the detectors 12 includes an area 22 of a conductive material in the substrate 16 and along the surface 20 which forms a Schottky-barrier junction with the substrate 16. The detector area 22 is preferably of either platinum silicide or palladium silicide. Around the edge of the detector area 22 is a guard-ring 24 in the form of a region of N+ type conductivity within the substrate 16 at the surface 20. A layer 26 of deposited silicon oxide is on the surface 20 of the substrate 16 and extends over the detector area 22. A metal layer 28 is on the silicon oxide layer 26 over each of the detector areas 22. The metal areas 28 are of a metal, such as aluminum, which will reflect infra-red radiation and serve as mirrors to reflect back into the detector area 22 any infrared radiation which may pass therethrough.

Figure 3:
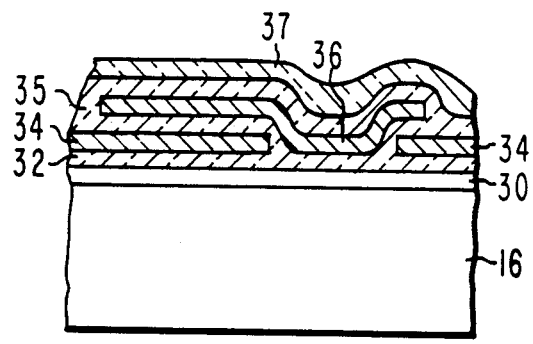
FIG. 3 is a sectional view taken along line 3—3 of FIG. 1.

The vertical CCD register 14 includes a channel 30 in the form of a region of N type conductivity within the substrate 16 and extending along the surface 20 between the columns of the detectors 12. The channel 30 is spaced from the adjacent edges of the detector area 22 of the detectors 12. A thermally grown layer 32 of silicon oxide extends over the channel 30. Two sets of gates 34 and 36 are on the silicon oxide layer 32 and extend across the channel 30 (see FIG. 3). The gates 34 and 36 are of a conductive material, such as doped polycrystalline silicon. The first set of gates 34 are all directly on the silicon oxide layer 32 and each of the gates 34 extends along a portion of two adjacent detectors 12 crossing the space between the two adjacent detectors 12. The adjacent ends of the adjacent gates 34 are spaced apart in the portion of the channel 30 adjacent a portion of the detector 12. Each of the first set of gates 34 has an extension 34a which extends over the substrate surface 20 between adjacent detectors 12 and is spaced from the substrate surface 20 by a portion of the silicon oxide layer 32. The gate extensions 34a electrically connect similar first gates 34 in all of the vertical CCD registers 14 and one of the extensions 34a extends to a terminal contact at one edge of the sensor array 10.

Each of the second gates 36 is on the oxide layer 32 between the spaced edges of two adjacent first gates 34. The second gate 36 extends slightly over one of the adjacent first gates 34 and extends over the other adjacent first gate 34 to the space between two adjacent detectors 12. The second gate 36 is spaced from the first gate 34 by a layer 35 of silicon oxide. Each of the second gates 36 has an extension 36a which extends over the extension 34a of the first gates 34 and is spaced therefrom by a silicon oxide layer. The extensions 36a electrically connect corresponding second gates 36 of the various vertical CCD registers 14. One of the extensions 36a extends to terminals at one edge of the image sensor array 10.

Each of the gates 34 and 36 extends up to the edge of the detectors 12 at each side of the vertical CCD register 14. Thus, the gates 34 and 36 project beyond each side of the channel 30 and over the portions of the substrate surface 20 between the channel 30 and each of the adjacent detectors 12. The gate extensions 34a and 36a also extend completely across the space between adjacent detectors 12 so as to extend up to the edge of the adjacent detectors 12. Preferably, the gates 34 and 36 and their extensions 34a and 36a are covered with a protection layer 37 of insulating material, such as a flowable borophosphosilicate glass.

The imager 10 is made in accordance with the present invention by first forming the CCD registers 14. This is achieved by first growing a thick layer of silicon oxide on the surface 20 of the substrate 16 by exposing the surface 20 to water vapor and hydrogen chloride at a temperature of about 900° C. A layer of a resist is then applied to the silicon oxide layer and, using standard photolithographic techniques, the resist layer is defined to leave it over the areas of the substrate surface 20 where thick oxide is desired. The portions of the thick silicon oxide layer exposed by the openings in the resist layer are then removed with a suitable etchant to expose the portions of the substrate surface 20. After removing the resist layer with a suitable solvent a thin layer of silicon oxide is grown on the exposed portions of the surface of the substrate.

A layer of resist material is coated on the silicon oxide layers and defined to provide it with openings over the portions of the substrate surface and thin oxide layer where the channels 30 are to be formed. Ions of an N type conductivity modifier, such as phosphorus, are then implanted through the openings in the resist layer and through the thin oxide layer into the substrate surface 20 to form the channels 30. The thin silicon oxide layer is then removed from the substrate surface 20 and a new silicon oxide layer of the desired thickness for the oxide layer 32 is then thermally grown on the substrate surface 20.

A first layer of polycrystalline silicon is then deposited over the silicon oxide layer, such as by chemical vapor deposition technique using silane ($SiH_4$) The first polycrystalline silicon layer is then doped, generally with phosphorus, to make it conductive. This may be achieved either by ion implantation or exposing the polycrystalline silicon layer to $POCl_3$ at 950° C. The first polycrystalline silicon layer is then defined, using standard photolithographic techniques and either chemical or plasma etching, to form the first set of gates 34 and their extensions 34a. During the etching of the first polycrystalline silicon layer to form the first set of gates 34, some or all of the silicon oxide layer 32 which is between the spaced edges of the first gates 34 may also be removed. Silicon oxide is then thermally grown over the defined first set of gates 34 and over any exposed portions of the substrate surface 20 between the spaced edges of the first gates 34.

A second layer of polycrystalline silicon is then deposited on the silicon oxide layer which is over the first set of gates 34 and their extensions 34a, and on the oxide layer between the spaced edges of the first gates 34. After the second polycrystalline silicon layer is doped, it is defined, using standard photolithographic techniques, and etched, to form the second set of gates 36 and their extensions 36a. Silicon oxide is then thermally grown over the second set of gates 36.

The detectors 12 are then formed on the substrate 16. Referring to FIGS. 4a–4d there is shown one method of the present invention for forming the detectors 12. In this method a layer 38 of a photoresist is applied to the silicon oxide layer 40 which is on the portion of the substrate surface 20 where the detectors 12 are to be formed and on the oxide layer 42 which is over the second gates 36 and their extensions 36a as shown in FIG. 3a. Using standard photolithographic techniques, an opening 44 is formed in the resist layer 38 over the area of the substrate surface 20 where the guard-rings 24 are to be formed. One edge of the opening 44 is adjacent the edges of the gates 34 and 36 and their extensions 34a and 36a and the other edge of the opening 44 is spaced slightly from the edges of the gates and their extensions. The area of the oxide layers 40 and 42 exposed by the opening 44 is then removed with a suitable etchant to form the opening 46 in the oxide layer 40. One edge of the opening 46 is defined by the edges of the gates 34 and 36 and their extensions 34a and 36a. An N type conductivity modifier, such as phosphorus, is then diffused into the substrate surface 20 exposed by the opening 46, such as from a $POCl_3$ source at 950° C. for about 10 minutes or by ion implantation with a dose of 3 to $10 \times 10^{15} cm^{-2}$. The resulting concentration of the ions diffused or implanted into the substrate 16 should be relatively high, about $1 \times 10^{20} cm^{-3}$. This completes formation of the guard rings 24.

Figure 4A:
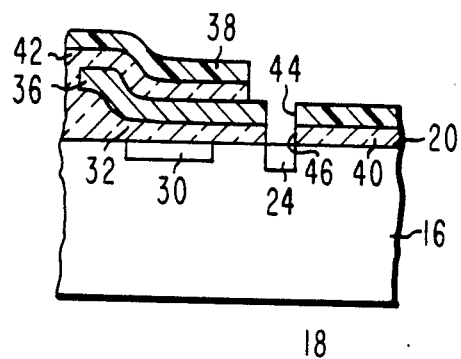
FIGS. 4a–4d are sectional views illustrating the steps of the method of the present invention for forming the detector of the IR-CCD.
Figure 4B:
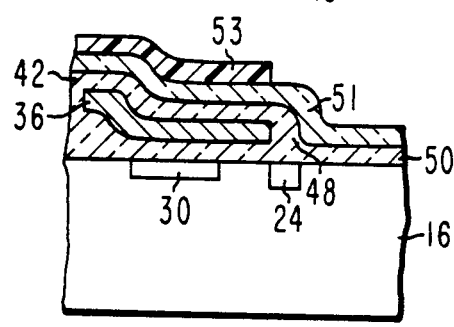

The oxide layer 40 over the area of the substrate surface 20 where the detectors 12 are to be formed is then removed with a suitable etchant, the remaining oxide layer remaining masked. This etch will also remove any oxide which had been formed over the guard-ring 24 during either the diffusion step or the anneal which generally follows an ion implantation. The substrate 16 is then thermally oxidized at a relatively low temperature, about 800° C., for example, in a pyrogenic oxidation furnace (a furnace which has an ambient of hydrogen and oxygen to form water vapor therein) with approximately 3% hydrogen chloride added. As shown in FIG. 4b, this results in an oxide layer 48 over the highly doped guard-ring 24 which is substantially thicker, 3 to 4 times thicker, than the oxide layer 50 formed on the portion of the substrate surface 20 which is inside the guard ring 24. This difference in oxide thickness results from the fact that the heavy doping in the guard ring 24 enhances the oxidation rate of the silicon.

As shown in FIG. 4b, a thick layer 51 of a flowable insulating material, such as a borophosphosilicate glass (BPSG), is then deposited over the entire device including the silicon oxide layers 42, 48 and 50. This can be accomplished by the deposition process described in U.S. Pat. No. 3,481,781 to W. Kern, issued Dec. 2, 1969 entitled "Silicate Glass Coating of Semiconductor Devices." The device is heated to the flow temperature of the glass, about 950° C. for BPSG, so that the glass flows and forms a smooth surface over which metal film conductors can be easily provided. Contact openings are then etched through the glass layer 51 where required, such as at the ends of the gate extensions 34a and 36a, and the glass is reflowed to provide the openings with smooth edges. A layer 53 of a resist material is coated over the glass layer 51 and is defined to provide it with openings over the areas where the detectors 12 are to be formed. It is preferable that the openings in the resist layer 53 be slightly larger than the area of the detectors 12.

Figure 4C:
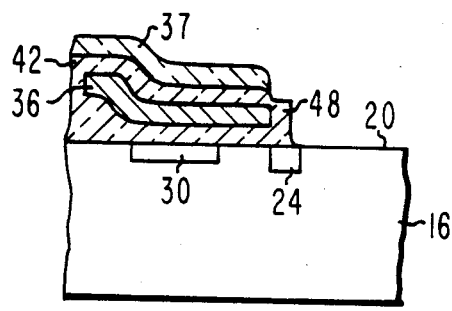

As shown in FIG. 4c, the exposed area of the glass layer 51 and the underlying oxide layer 50 are then removed to expose the areas of the substrate surface 20 where the conductive detector areas 22 are to be formed. The oxide layer 50 is removed with a suitable etching operation such as by a chemical etchant (buffered hydrofluoric acid) or by plasma etching. Although the oxide layer 48 over the guard-ring 24 will be etched at the same time as the oxide layer 50, since the oxide layer 48 is much thicker than the oxide layer 50, the oxide layer 50 can be entirely removed without removing all of the oxide layer 48 over the guard-ring 24. If a chemical etchant is used, the thicker oxide layer 48 will be etched back slightly to expose a portion of the guard band 24 as shown in FIG. 3c. The etching of the glass layer 51 forms the protective layer 37 over the CCD registers 14.

Figure 4D:
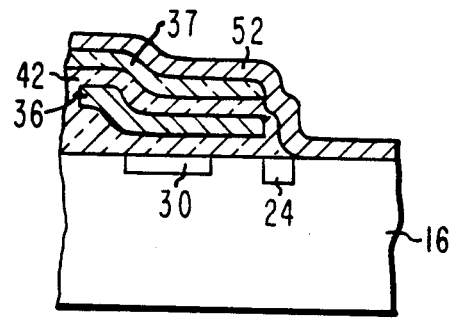

As shown in FIG. 4d, a layer 52 of platinum or palladium is then coated over the device including the exposed area of the substrate surface 20, such as by the well-known technique of evaporation or sputtering. The device is then heated at a temperature of about 320° C. which causes the metal layer 52 to react with the silicon of the substrate 16 and form a silicide conductive layer 22 along the substrate surface 20. Any excess metal can then be removed with a suitable etchant, such as aqua regia. The imager 10 can then be completed in any well-known manner. This would include depositing the oxide layer 26 over the conductive region 22, applying the mirror layer 28 over the oxide layer 26 and providing any contacts to the extensions 34a and 36a of the gates.

Figure 5A:
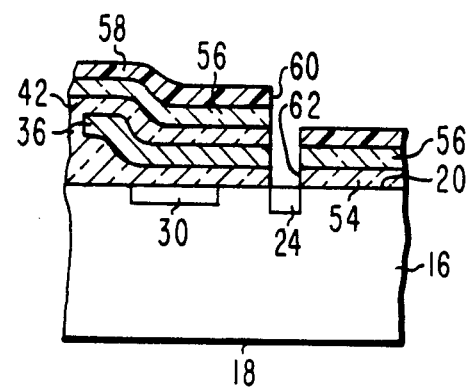
FIGS. 5a–5c are sectional views showing the steps of a modification of the method of the present invention.
Figure 5B:
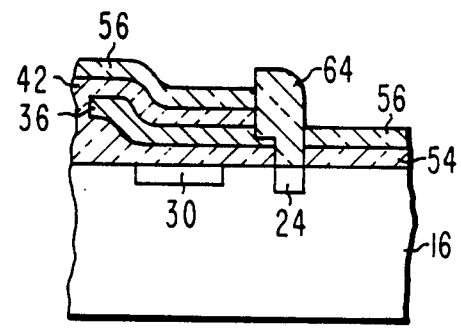
Figure 5C:
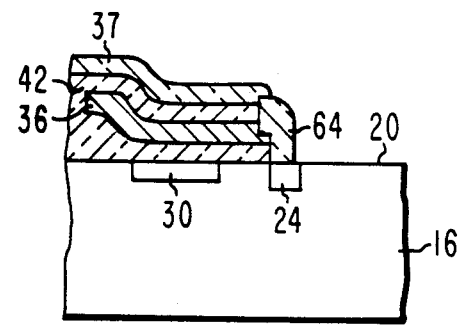

Referring to FIG. 5a-5c, there is illustrated a modification of the method of the present invention for making the detectors 12. In this method, as in the method previously described, the CCD registers 14 are formed first in the manner previously described. The silicon oxide on the areas of the substrate surface 20 where the detectors 12 are to be formed is then removed with a suitable etchant. As shown in FIG. 5a, a thin layer 54 of silicon oxide is then grown over the exposed area of the substrate surface 20 using pyrogenic steam at about 900° C. A layer 56 of silicon nitride is then deposited on the silicon oxide layer 54 as well as on the silicon oxide layer 42 over the gates of the CCD register 14. The silicon nitride layer 56 is deposited by low pressure chemical vapor deposition from a mixture of silane and ammonia. A layer 58 of photoresist is coated over the silicon nitride layer 56, and, using standard photolithographic techniques, an opening 60 is formed in the photoresist layer 58 over the area of the substrate surface 20 where the guard band 24 is to be formed. One edge of the opening 60 is formed adjacent the edge of the gates 34 and 36 and their extensions 34a and 36a, and the other edge of the opening 60 is spaced from the edge of the gates.

The portion of the silicon nitride layer 56 exposed by the opening 60 is then removed with a suitable etchant, such as a plasma etch, to expose a portion of the silicon oxide layer 54. The exposed portion of the silicon oxide layer 54 is then removed with a suitable etchant, either a chemical etchant or by a plasma etch, to form an opening 62 therethrough, one side of which is defined by the edges of the gates 34 and 36 and their extensions 34a and 36a. A high concentration of an N type conductivity modifier, such as phosphorus, is then embedded in the exposed area of the substrate surface 20 to form the guard-ring 24. This may be achieved by either diffusion from POCl₃ at 950° C. or by ion implantation.

The exposed area of the substrate surface 20 is then oxidized at about 900° C. in pyrogenic steam with about 3% hydrogen chloride added. As shown in FIG. 5b this forms a thick oxide layer 64 over the highly doped guardrings 24 but with little, if any, oxide growth of the oxide layers covered by the silicon nitride layer 56. As shown in FIG. 5c, the silicon nitride layer 56 is then removed, such as by hot phosphoric acid.

As was described previously with regard to the method shown in FIGS. 4a-4d, a layer of a flowable insulating material, such as BPSG, is coated over the entire device and heated to cause it to flow and have a smooth surface. Contact openings are formed in the glass layer and it is reflowed to smooth out the corners of the openings. A layer of a resist material is coated over the glass layer and is defined to provide it with openings over the areas where the detectors 12 are to be provided. The exposed areas of the glass layer are then removed with a suitable etchant. The silicon oxide layer 54 is then removed with a suitable etchant, such as a chemical etchant or by plasma etching. Although this etching operation will remove some of the oxide layer 64, since the oxide layer 64 is so much thicker than the oxide layer 54, the oxide layer 54 can be completely removed without removing all of the thicker oxide layer 64. If a chemical etchant is used, the thick oxide layer 64 will be etched back slightly to expose a portion of the guard-ring 24. The detectors 12 can then be completed in the manner previously described by coating a layer of the desired metal over the device and heating it to form a metal silicide layer on the substrate surface 20. Any excess metal can then be removed with a suitable etchant.

Figure 6A:
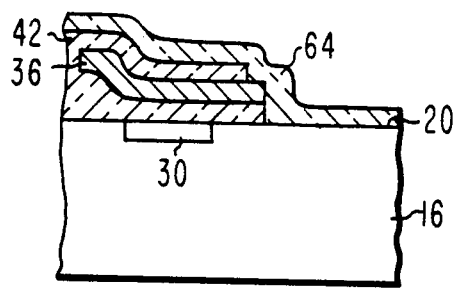
FIGS. 6a–6d are sectional views showing the steps of still another modification of the method of the present invention.
Figure 6B:
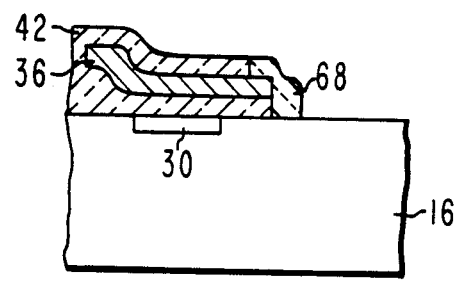

Referring to FIGS. 6a-6d, there is shown the steps of another modification of the method of the present invention for forming the detectors 12. In this modification, like the others, the CCD registers 14 are formed first followed by the removal of the oxide layer from the areas of the substrate surface 20 where the detectors 12 are to be formed. Then, as shown in FIG. 6a, a conformal layer 64, i.e. one with approximately equal thickness on the top and sides of a step, of an insulating material containing phosphorus, such as a phosphosilicate glass, is deposited over the device including the area of the surface 20 where the detectors 12 are to be formed. The layer 64 can be deposited by a low pressure chemical vapor deposition technique well-known in the art.

Figure 6C:
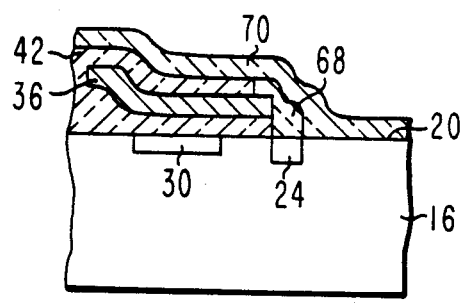

The insulating layer 64 is then etched down to the substrate surface 20 using an anisotropic etch, such as a plasma or reactive ion etch, which, as shown in FIG. 5b leaves stringers 68 (narrow strips) of the insulating material at the edge of the gates 34 and 36 and their extension 34a and 36a. A capping layer 70 of silicon oxide is then deposited over the device as shown in FIG. 6c. The device is then heated at a relatively high temperature, about 1000° C., to drive the phosphorus from the stringers 68 into the substrate 16 to form the guard rings 24. As shown in FIG. 6c, the phosphorus will not only diffuse downwardly into the substrate 16 but also slightly laterally along the substrate surface 20 so that the guard-ring 24 will project slightly beyond the stringer 68.

Figure 6D:
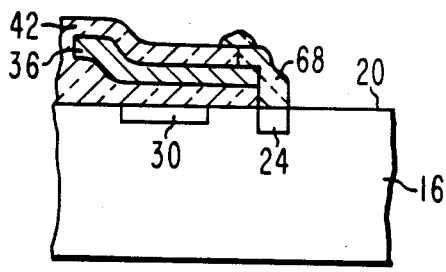

The capping layer 70 is then removed from over the area of the substrate surface 20 where the detectors 12 are to be formed using either a chemical etchant or plasma etching. When removing the capping layer 70, care should be taken to leave at least some of the stringers 68 over the guard-rings 24 as shown in FIG. 6d. The detectors 12 are then completed in the manner as previously described by depositing a layer of a metal over the device and heating the device to form the metal silicide on the substrate surface 20. Any excess metal is removed with a suitable etchant.

Thus, there is provided by the present invention methods of making an imager which includes an array of detectors and charge-coupled devices for transferring charge from the detectors wherein the detectors are self-aligned with the gates of the charge-coupled devices. This provides an imager wherein the detectors utilize most of the area of the substrate surface which is not taken up by the charge-coupled devices so as to increase the fill-factor of the imager. The self-alignment techniques used in the method of the present invention not only provide for a more complete utilization of the area of the substrate for the detectors but also provide for proper alignment of the conductive detector layers with their surrounding guard-rings.

Although the method of the present invention described with regard to FIGS. 4a–4d require a highly doped guard ring region 24, the modifications of the method described with regard to FIGS. 5a–5c and FIGS. 6a–6d do not require such a heavy doping of the guard ring region. However, if the guard ring regions 24 are not highly doped so as to be highly conductive, a separate highly conductive region must be provided along the edge of each detector area 22 adjacent a second gate 36 of the CCD register 14 with the highly conductive region contacting the detector area 22. The highly conductive region would serve to conduct charge from the detector area 22 to the channel 30 of the CCD register 14.

We claim:

1. In a method of making an imager which includes a substrate of single crystalline silicon of one conductivity type having along one surface thereof a charge-coupled device formed of a channel region within said substrate and extending along said substrate surface and a plurality of conductive gates along said channel and extending transversely across the channel, the steps of
    forming in said substrate at said one surface a narrow guard-ring region which extends along and has one edge in substantial alignment with the ends of at least some of the gates and a second edge spaced from the ends of the gates,
    forming a layer of insulating material over said guard-ring region with an edge of the insulating material being in substantial alignment with the second edge of the guard-ring region, and
    forming on said surface of a substrate a conductive layer which forms a Schottky-barrier junction with the substrate with the conductive layer having an edge in substantial alignment with the second edge of the guard-ring region.

2. A method in accordance with claim 1 in which the guard-ring region is formed by forming a layer of silicon oxide on the area of the substrate surface where the guard-ring region and conductive layer are to be provided, etching an opening through said silicon oxide layer over the area of the substrate surface where the guard-ring region is to be formed, with one edge of the opening being defined by the edge of the gates of the charge-coupled device, and embedding a high concentration of a conductivity modifier of the type opposite to that of the substrate into the substrate through the opening in the silicon oxide layer.

3. A method in accordance with claim 2 in which after the guard-ring region is formed a layer of silicon oxide is grown over the guard-ring region which is substantially thicker than the silicon oxide layer over the area of the substrate surface where the conductive layer is to be formed.

4. A method in accordance with claim 3 in which after the thick silicon oxide layer is grown over the guard-ring region, the thinner silicon oxide layer over the area of the substrate surface where the conductive layer is to be provided and the thicker silicon oxide layer are subjected to an etchant which completely removes the thinner silicon oxide layer but does not completely remove the thicker silicon oxide layer.

5. A method in accordance with claim 4 in which after the thin silicon oxide layer is removed, a layer of a metal is coated over the area of the surface of the substrate where the conductive layer is to be provided and the substrate is heated to form a metal silicide conductive layer on the surface of the substrate.

6. A method in accordance with claim 5 in which after the metal silicide conductive layer is formed any excess metal is removed.

7. A method in accordance with claim 5 in which when the thick and thin silicon oxide layers are etched, the thick silicon oxide layer is etched back to expose an edge of the guard-ring region at the surface of the substrate and the metal layer is also coated over the exposed edge of the guard-ring region so that the metal silicide conductive layer overlaps and contacts the guard-ring region.

8. A method in accordance with claim 5 in which after the guard-ring region is formed the silicon oxide layer over the area of the substrate surface where the conductive layer is to be provided is removed and a silicon oxide layer is grown simultaneously over the guard-ring region and the area where the conductive layer is to be provided with a portion of the oxide layer over the guard-ring region being substantially thicker than the portion over the remaining area of the substrate surface.

9. A method in accordance with claim 5 wherein prior to forming the guard-ring region a layer of silicon nitride is formed over the silicon oxide layer which is over the area of the substrate surface where the guard-ring region and conductive layer are to be provided and an opening is formed in the silicon nitride layer over the area where the guard-ring region is to be formed before etching the opening in the silicon oxide layer.

10. A method in accordance with claim 9 in which after the thick silicon oxide layer is formed over the guard-ring region the silicon nitride layer is removed and then the thinner silicon oxide over the area of the substrate surface where the conductive layer is to be provided is removed.

11. A method in accordance with claim 1 wherein the guard-ring region is formed by removing any silicon oxide from the surface of the substrate where the guard-ring region and conductive layer are to be formed up to the edges of the gates of the charge-coupled device, coating the device including the exposed surface area of the substrate surface with a layer of an insulating material containing a conductivity modifier of the type opposite to that of the substrate, removing said insulating layer except for narrow strips extending along the edges of the gates, and heating the device to diffuse the conductivity modifier from the narrow strip of the insulating material into the substrate to form the guard-ring region.

12. A method in accordance with claim 11 in which the insulating layer is a conformal layer and it is removed by an anisotropic etching technique to leave the narrow strips.

13. A method in accordance with claim 11 in which prior to heating the device a capping layer of silicon oxide is coated over the device including the narrow strips and after the diffusion of the conductivity modifier into the substrate the silicon oxide layer is removed from over the area of the substrate surface where the conductive layer is to be formed.

14. In a method of making an imager which includes a substrate of single crystalline silicon of one conductivity type having along one surface thereof a plurality of spaced, parallel charge-coupled transfer devices, each formed of a channel region within said substrate and extending along said substrate surface and a plurality of conductive gates along said channel and extending transversely across the channel, at least some of said gates having extensions extending across the space between the charge-coupled devices and electrically connecting corresponding gates of the charge-coupled devices, said gates and extensions defining separate detector areas on said substrate surface which are surrounded by the gates and gate extensions, the steps of making detectors at said detector areas comprising
 forming in each detector area a narrow guard-ring region which extends along and has one edge in substantial alignment with the edges of the surrounding gates and gate extensions and a second edge spaced from the gates and gate extensions,
 forming a layer of insulating material over each guard-ring region with an edge of the insulating material being in substantial alignment with the second edge of the guard-ring region, and
 forming on each detector area of the substrate surface a conductive layer which forms a Schottky-barrier junction with the substrate, with the conductive layer having an edge in substantial alignment with the second edge of the guard-ring region.

15. A method in accordance with claim 14 in which the guard-ring regions are formed by forming a layer of silicon oxide on the detector areas of the substrate surface, etching an opening through said silicon oxide layer over the area of the substrate surface where each guard-ring region is to be formed with one edge of the opening being defined by the edges of the surrounding gates and gates of the charge-coupled devices, and embedding a high concentration of a conductivity modifier of the type opposite to that of the substrate into the substrate through the openings in the silicon oxide layer.

16. A method in accordance with claim 15 in which after the guard-ring regions are formed a layer of silicon oxide is grown over the guard-ring regions which is substantially thicker than the silicon oxide layer over the remaining area of the detector areas of the substrate surface.

17. A method in accordance with claim 16 in which after the thick silicon oxide layer is grown over the guard-ring region the thinner silicon oxide layer over the detector area of the substrate surface and the thicker silicon oxide layer are subjected to an etchant which completely removes the thinner silicon oxide layer but does not completely remove the thicker silicon oxide layer.

18. A method in accordance with claim 17 in which after the thin silicon oxide layer is removed the layer of a metal is coated over the detector areas of the surface of the substrate and the substrate is heated to form a metal silicide conductive layer on the substrate.

19. A method in accordance with claim 18 in which after the metal silicide conductive layer is formed any excess metal is removed.

20. A method in accordance with claim 18 in which when the thick and thin silicon oxide layers are etched, the thick silicon oxide layer is etched back to expose an edge of the guard-ring region at the surface of the substrate and the metal layer is also coated over the exposed edge of the guard-ring region so that the metal silicide conductive layer overlaps and contacts the guard-ring region.

21. A method in accordance with claim 18 in which after the guard-ring region is formed the silicon oxide layer over the detector areas of the substrate surface is removed and a silicon oxide layer is grown simultaneously over the entire detector area, with a portion of the oxide layer over the guard-ring region being substantially thicker than the portion over the remaining detector area.

22. A method in accordance with claim 18 wherein prior to forming the guard-ring region a layer of silicon nitride is formed over the silicon oxide layer which is over the detector area of the substrate surface and an opening is formed in the silicon nitride layer over the area where the guard-ring region is to be formed, before etching the opening in the silicon oxide layer.

23. A method in accordance with claim 22 in which after the thick silicon oxide layer is formed over the guard-ring region the silicon nitride layer is removed and then the thinner silicon oxide over the detector area is removed.

24. A method in accordance with claim 14 wherein the guard-ring region is formed by removing any silicon oxide from the detector areas of the substrate surface up to the edges of the surrounding gates and gate extensions of the charge-coupled device, coating the device including the exposed detector areas of the substrate surface with a layer of an insulating material containing a conductivity modifier of the type opposite to that of the substrate, removing said insulating layer except for narrow strips extending along the edges of the gates and gate extensions, and heating the device to diffuse the conductivity modifier from the narrow strip of the insulating material into the substrate to form the guard-ring region.

25. A method in accordance with claim 24 in which the insulating layer is a conformal layer and it is removed by an anisotropic etching technique to leave the narrow strips.

26. A method in accordance with claim 24 in which prior to heating the device a capping layer of silicon oxide is coated over the device including the narrow strips and after the diffusion of the conductivity modifier into the substrate the silicon oxide layer is removed from over the detector area of the substrate surface.

* * * * *